United States Patent [19]

van de Pas et al.

[11] Patent Number: 4,465,153

[45] Date of Patent: Aug. 14, 1984

[54] METHOD OF CODING AND DECODING MESSAGES

[75] Inventors: Andries J. M. van de Pas; Antonius C. J. van den Ende, both of Eindhoven, Netherlands

[73] Assignee: U.S. Philips Corporation, New York, N.Y.

[21] Appl. No.: 228,496

[22] Filed: Jan. 26, 1981

[30] Foreign Application Priority Data

Feb. 4, 1980 [NL] Netherlands ............... 8000675

[51] Int. Cl.$^3$ .............................................. H04L 9/00
[52] U.S. Cl. ................... 178/22.16; 178/22.17; 178/22.19; 178/22.13
[58] Field of Search ............... 178/22.01, 22.02, 22.09, 178/22.1, 22.13, 22.14, 22.19, 22.16, 22.17

[56] References Cited

U.S. PATENT DOCUMENTS

| | | | |
|---|---|---|---|
| 3,291,908 | 12/1966 | Ehrat | 178/22.13 |
| 3,752,920 | 8/1973 | Gemperle | 178/22.13 |
| 4,211,891 | 7/1980 | Glitz | 178/22.19 X |
| 4,227,253 | 10/1980 | Ehrsam et al. | 178/22.01 |

Primary Examiner—Sal Cangialosi
Assistant Examiner—K. R. Kaiser
Attorney, Agent, or Firm—Edward W. Goodman; Joseph P. Abate

[57] ABSTRACT

Method of coding and decoding messages wherein a basic key and a random message key, which is transmitted prior to the message, are used. Using a plurality of basic keys entails the problem that the proper basic key must be set in the receiving station. In accordance with the present method, the sequence of a portion (II) of the message key and of a number of check characters derived therefrom are coded, prior to the actual message transmission, using the basic key and a different portion (I) of the message key. Decoding in the receiving station is done by using a basic key which is chosen from a group of basic keys, and the different portion (I) of the message key. A test circuit 21 examines whether the decoded check characters correspond to the check characters derived in the receiving station from the decoded portion (II) of the message key. A positive test result indicates that the desired basic key has been found.

1 Claim, 1 Drawing Figure

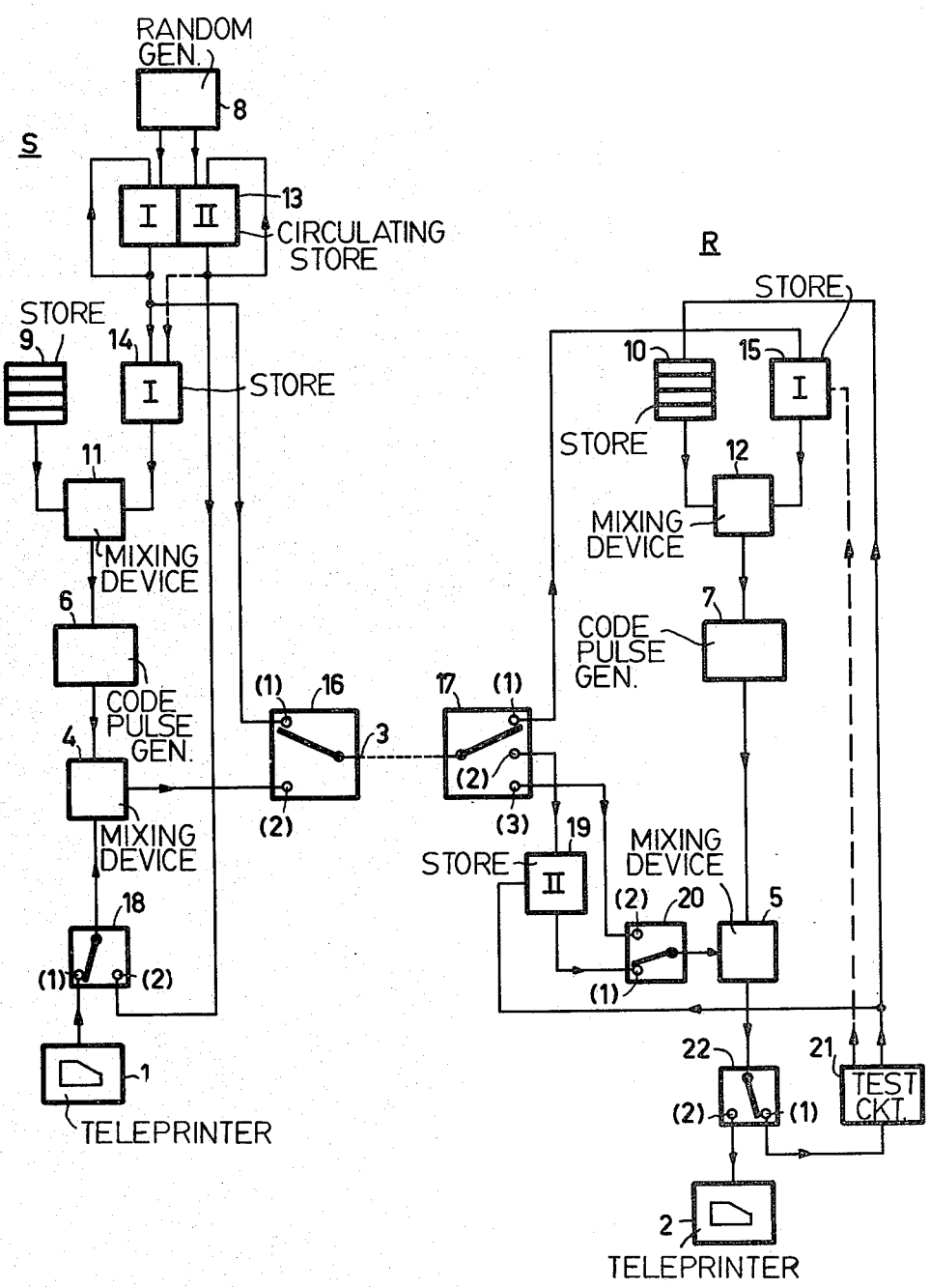

METHOD OF CODING AND DECODING MESSAGES

BACKGROUND OF THE INVENTION

The invention relates to a method of coding and decoding messages in which clear message pulses are mixed with code pulses at a transmitting station to form a coded message and in which the coded message pulses are mixed with identical code pulses at a receiving station to obtain the clear message pulses, the code pulses in the transmitting station and the receiving station being generated by a code generator the initial state of which determines the code pulse sequence, there being numerous possible initial states, and the initial state being determined from a first state information, designated the basic key, at the transmitting and receiving stations, and from a second state information, designated the message key, determined at random at one of the stations and transmitted to the other station.

Such a method is disclosed in U.S. Pat. No. 3,291,908.

In telecommunication networks in which, for reasons of secrecy of the messages, the above-mentioned method is used, there is often the need for a plurality of basic keys, for example, to render it possible to divide the stations into groups each having their own basic key or to classify messages into groups each having their own basic key. The number of basic keys which, for obvious reasons may alternatively be designated day keys, may amount to some dozens. The day keys are usually stored in protected storage compartments of the coding equipment: the designation key compartmentation was introduced.

The use of a plurality of day keys requires in a receiving station the setting of the proper day key, which may depend on the opposite station and/or the nature of the message. So far this setting has been done manually, which requires an action on the part of an operator, this manual setting also including the risk of mistakes.

SUMMARY OF THE INVENTION

It is an object of the invention to provide a method of the type described in the opening paragraph in accordance with which the proper day key (basic key) is automatically set in the receiving station.

According to the invention, the method is therefore characterized in that for the case where a plurality of possible basic keys have been stored, in the transmitting and in the receiving station, prior to the processing of the message pulses, a first portion of a message key is combined with a chosen basic key to determine an initial state of the code generator and, in the transmitting station, the clear message key pulses, which represent a sequence of a second portion of the message key, and a number of check characters derived therefrom, are mixed with the code pulses to obtain a coded message key, and the coded message key pulses are mixed in the receiving station with the code pulses, this last step being repeated, starting from, each time, a different basic key, until this mixing results in a sequence of a decoded second portion of the code shift information and a number of decoded check characters, which correspond to the check characters derived in the receiving station from the decoded second portion of the message key, so that the proper initial state of the code generator in the receiving station required for the proper decoding of the coded message pulses can be determined by the basic code which was determined last and the combination of the first and the second portions of the message key.

DESCRIPTION OF THE DRAWING

The invention will now be further explained with reference to the sole FIGURE of the accompanying drawing, which shows a block schematic diagram of a system comprising a transmitting station and a receiving station, for carrying out the method according to the invention.

DESCRIPTION OF THE PREFERRED EMBODIMENT

The sole FIGURE shows a transmitting station S and a receiving station R of a system for the transmission of information with secrecy, in such a detail as is necessary to explain the method according to the invention.

It should be noted that the method according to the invention has for its sole purpose to enable the detection of the proper day key in the receiving station. The subsequent coding and decoding of the message pulses can be effected in the manner as described in U.S. Pat. No. 3,291,908. The receiving station R and the transmitting station S are shown in sufficient detail to explain the method according to the invention. The configuration for coding and decoding of the message pulses is only shown symbolically.

The transmitting station S comprises a transmitter 1 for clear text, for example, a teleprinter; the receiving station R comprises a receiver 2 for clear text, for example, also a teleprinter.

Messages which are transmitted from transmitting station S to receiving station R by way of transmission channel 3 are coded in the transmitting station by mixing the message pulses with a sequence of code pulses in a mixing device 4. In the receiver, the coded message pulses are mixed with an identical sequence of code pulses in a mixing device 5. The sequence of code pulses, which are distributed purely at random, is generated in the transmitting station S by a code pulse generator 6 and in the receiving station R by an identical code pulse generator 7. The result is a sequence of clear message pulses at the output of mixing device 5, if the pulse generators 6 and 7 indeed produce identical sequences of code pulses.

A sequence of code pulses is determined by the initial state of the code pulse generator, whose number of initial states is very large compared with 10 exp. 10 ($10^{10}$).

The initial state of pulse generator 6 is determined by a day key and a message key. The message key is produced by a random generator 8. The day key has been stored in a protected store 9. The message key is transmitted to the receiving station by way of transmission channel 3. In the receiving station the day key has been stored in a protected store 10. The initial state of the pulse generator 7 can therefore be determined by means of the day key from store 10 and the received message key. Here, the secrecy of the information transmission resides in the initial state of the pulse generator. The information about the initial state is obtained by mixing the day key with the message key in the mixing devices 11 and 12.

The mixing devices 4, 5, 11 and 12 and the pulse generators 6 and 7 and the random generator 8 may be of a prior art construction, such as demonstrated in, for example, U.S. Pat. No. 3,291,908.

Let now the case be considered that a number of day keys are used and the receiving station is to make a choice from a group of day keys. The day keys are stored in compartments of the stores 9 and 10 and can be obtained therefrom on call. A certain day key is chosen in the transmitting station S. Let it be assumed that in the receiving station R this day key is stored in one of the storage compartments of store 10. It is assumed that there is no à priori knowledge as regards the compartment in which this day key has been stored.

The message key is generated by random generator 8. A certain method is now followed which must render it possible to determine the day key automatically in the receiving station.

The message key which consists of, for example, ten characters is divided into a first portion I consisting of five characters, and a second portion II, also of five characters. The message key is stored in a circulating store 13. Portion I of the code shift information is also stored in a store 14.

Portion I of the message key is mixed with the day key in mixing device 11. The result of this mixing operation determines the intitial state of the code pulse generator 6. Furthermore, portion I of the message key is transmitted to the store 15 of the receiving station by way of transmission channel 3, the switching circuits 16 and 17 having been set to position (1) for this purpose. In order to increase the reliability and to indicate the start of a new message, this transmission may be repeated a number of times, for example, five times, the store 13 having been provided with a return line for this purpose.

After the transmission of portion I of the message key, a sequence of repetitions of portion II of the message key is coded by mixing them with the code pulses of pulse generator 6, the initial state of which has been determined by the day key and portion I of the message key. For this, portion II of the message key is applied a number of times, for example, five times, to the mixing device 4, the switching circuit 18 having been set to position (2) for this purpose. The mixing operation results in a coded message key consisting of a coded sequence of five repetitions of portion II of the clear message key. The coded message key is transmitted to store 19 of the receiving station by way of transmission channel 3, the switching circuits 16 and 17 having been set to position (2) for this purpose.

In the receiving station, the day key from a random compartment of store 10 is mixed with portion I of the message key in mixing device 12. The result of this mixing operation determines the initial state of code pulse generator 7.

The coded message key stored in store 19 is decoded by mixing it with the code pulses of pulse generator 7. To this end, the coded message key is applied to mixing device 5, switching circuit 20 having been set to the position (1) for this purpose. The result of the mixing operation is applied to test circuit 21, switching circuit 22 having been set to position (1) for this purpose.

The coded message key consists of a coded sequence of five repetitions of portion II of the message key, so of five times five or twenty-five characters. The test circuit 21 examines whether the twenty-five decoded characters form five equal groups of five characters, a certain probability of transmission errors being taken into account. For this purpose, it is examined whether the first bit of each character corresponds to the first bits of all the other characters. This procedure is repeated for the second bit and the following bits of each character. When the number of times there is agreement is below a preset threshold value, the outcome of the test is negative, the outcome of the test being positive in the other case.

When the test performed by test circuit 21 has a negative result, then the day key of another compartment of store 10 is chosen, under the control of the test circuit 21. In addition, under the control of test circuit 21, the coded message key of store 19 is again applied to mixing device 5. If the result of the test is again negative, another compartment of store 10 is chosen and the above procedure is repeated until a positive test result has been obtained. The day key searched for is then the day key of the compartment of the store 10 which was chosen last.

After a positive test result, portion II of the message key may be applied by way of the dotted connection from test circuit 21 to store 15. The initial state of pulse generator 7 can then be determined by mixing the day key determined last with the complete message key. The receiving station may further be adjusted to the state for the decoding of the message pulses, in which state the switching circuit 17 is in position (3) and the switching circuits 20 and 22 are in the position (2).

After transmission of the coded message key, portion II of the message key may be applied in the transmitting station from store 13 to store 14 by way of the broken line connection. The initial state of the pulse generator 6 can then be determined by mixing the day key with the complete message key. Furthermore, the transmitting station may be adjusted to the state for message pulse coding, the switching circuit 16 being in position (2) and the switching circuit 18 in position (1) in this state.

Coding and decoding of the messages using the day key determined in the transmitting station and the day key which was automatically selected in the receiving station, and the message key which was determined randomly in the transmitting station and transmitted to the receiving station, may now be done in known manner.

It has been described hereinbefore that a coded sequence of repetitions of portion II of the code shift information is transmitted to the receiving station by the transmitting station. When this sequence is decoded with the proper day key, a sequence of repetitions of portion II of the message key is obtained. If, however, a different day key is used, a sequence of comparatively random characters is obtained, which does not comprise the characteristic repetition of a group of characters as would be the case when the proper day key is used. It is possible to determine a criterion by means of which a sequence of comparatively random characters may be distinguished from a sequence in which repetitions of a group of characters occurs. This function is performed by test circuit 21.

Instead of the transmission of a coded sequence of a number of repetitions of portion II of the message key, the transmission of a coded sequence of portion II of the message key and of a number of check characters computed therefrom may alternatively be used in the above-described method. After decoding of this sequence, check characters are calculated in the receiving station from the decoded portion II of the message key, in the same manner as in the transmitting station. These check characters, generated in the receiving station, are compared with the decoded characters. When the number of times there is agreement is below a preset threshold value, the result of the test is negative and decoding was apparently started from the wrong day key. Decoding is then effected once again, but now with a different day key. This is, if necessary, repeated, each time with a different day key, until the check characters generated in the receiving station agree (predominantly) with the decoded check characters. In this manner the result obtained with the transmission of check characters is the same as obtained with the transmission of the repetitions of portion II of the message key.

Computing the check characters may be done in a manner which is customary for error detecting or error correcting codes. It should be noted that a simple repetition of a message character provides already a check character, in the sense that an error in the message character can be detected therewith. The notion, check character, includes not only the case of a character repetition but also a check character which was computed in a more complicated manner from the message characters.

What is claimed is:

1. A method of coding and decoding messages wherein clear message pulses are mixed with code pulses at a transmitting station to form coded message pulses and wherein the coded message pulses are mixed with identical code pulses at a receiving station to obtain the clear message pulses, the code pulses in the transmitting and receiving stations being generated by a code generator, the initial state of which determines the code pulse sequence, there being numerous possible initial states, and the initial state, in both the transmitting and receiving stations, being determined from a first state information, designated as one of a plurality of basic keys stored at both the transmitting and receiving stations, and a second state information, designated a message key determined at random in the transmitting station and transmitted to the receiving station; characterized in that, prior to processing the clear message pulses, the method comprises the steps: In the transmitting station;

(a) transmitting a first portion of the message key to the receiving station;

(b) selecting one of said plurality of basic keys and mixing said first portion with said selected basic key for determining an initial state for the code generator which then generates a resulting code pulse sequence;

(c) mixing a second portion of the message key, followed by a plurality of check characters derived from the second portion, with said resulting code pulse sequence from the code generator forming a coded second portion of the message key;

(d) transmitting said coded second portion of the message key to the receiving station;

(e) combining said first and second portions of the message key with said selected basic key to determine a final intitial state of said code generator for coding said message pulses; and in the receiving station:

(f) receiving and storing said first portion of the message key;

(g) receiving and storing said coded second portion of the message key;

(h) selecting and mixing one of said plurality of basic keys stored at said receiving station with said stored first portion for determining an initial state of the code generator which then generates a resulting code pulse sequence;

(i) mixing said stored coded second portion with said resulting code pulse sequence to decode said coded second portion;

(j) generating check characters from said decoded second portion and comparing the generated check characters with those following the second portion;

(k) repeating steps h-j with another one of said plurality of basic keys if the results of said comparison are not above a prescribed threshold level, which level would be indicative of a proper decoding and that the selected basic key would be the same as the selected basic key in the transmitting station; and (l) storing said decoded second portion of the message key for combination with said stored first portion in preparation for the proper decoding of the forthcoming coded message pulses.

* * * * *